United States Patent
Chellamuthu et al.

(10) Patent No.: US 12,088,289 B2
(45) Date of Patent: Sep. 10, 2024

(54) SOFT HANDOVER IN A COUPLED DUAL-OSCILLATOR SYSTEM

(71) Applicant: TEXAS INSTRUMENTS INCORPORATED, Dallas, TX (US)

(72) Inventors: Shanmuganand Chellamuthu, Richardson, TX (US); Qunying Li, Allen, TX (US); Vikram Joseph Mani, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/350,727

(22) Filed: Jun. 17, 2021

(65) Prior Publication Data

US 2022/0407516 A1 Dec. 22, 2022

(51) Int. Cl.
*H03K 17/95* (2006.01)
*H03B 5/04* (2006.01)
*H03B 5/12* (2006.01)
*H03K 17/732* (2006.01)

(52) U.S. Cl.
CPC ......... *H03K 17/9542* (2013.01); *H03B 5/04* (2013.01); *H03B 5/1209* (2013.01); *H03K 17/732* (2013.01)

(58) Field of Classification Search
None
See application file for complete search history.

(56) References Cited

U.S. PATENT DOCUMENTS

| | | | |
|---|---|---|---|
| 3,806,635 A | 4/1974 | Abbott et al. | |
| 5,384,697 A | 1/1995 | Pascucci | |
| 10,566,903 B1* | 2/2020 | Miller | G08B 21/24 |
| 2002/0177932 A1* | 11/2002 | Kifuku | B62D 5/0481 180/443 |
| 2010/0271144 A1* | 10/2010 | McCorquodale | H03B 5/04 331/117 FE |
| 2020/0091608 A1 | 3/2020 | Alpman et al. | |
| 2023/0059686 A1* | 2/2023 | Poloni | G05B 23/0243 |

FOREIGN PATENT DOCUMENTS

| | | |
|---|---|---|
| CN | 101933226 A | 12/2010 |
| CN | 104052402 A | 9/2014 |

OTHER PUBLICATIONS

International Search Report in corresponding PCT Application No. PCT/US2022/033180, dated Oct. 11, 2022 (5 pages).

* cited by examiner

*Primary Examiner* — Daniel C Puentes
(74) *Attorney, Agent, or Firm* — John R. Pessetto; Frank D. Cimino (57) ABSTRACT

A system includes a sensor integrated circuit (IC), including a driver adapted to be coupled to an oscillator, the driver including first and second transistors. The sensor IC includes an amplitude control amplifier coupled to the first transistor. The sensor IC also includes a common mode control amplifier coupled to the second transistor. The sensor IC includes a handover control circuit coupled to the amplitude control amplifier and configured to hand off an operation from the sensor IC to a different sensor IC, the handover control circuit including a resistor network coupled to a switch network.

13 Claims, 8 Drawing Sheets

SOFT HANDOVER IN A COUPLED DUAL-OSCILLATOR SYSTEM

BACKGROUND

In modern automotive and industrial applications, sensors are useful for determining the location, speed, acceleration, angle, or other attributes of a component. These attributes are monitored, and actions may be taken in response to the level of the attribute or to a change in the attribute. To achieve a high standard for safety and reliability requirements, redundant system designs are used. With redundant system designs, multiple independent and identical, or near-identical, sensors are useful, so the system continues operating safely even if one or more sensors undergo a fault or are otherwise shut down.

SUMMARY

In accordance with at least one example of the description, a system includes a sensor integrated circuit (IC), including a driver adapted to be coupled to an oscillator, the driver including first and second transistors. The sensor IC includes an amplitude control amplifier coupled to the first transistor. The sensor IC also includes a common mode control amplifier coupled to the second transistor. The sensor IC includes a handover control circuit coupled to the amplitude control amplifier and configured to hand off an operation from the sensor IC to a different sensor IC, the handover control circuit including a resistor network coupled to a switch network.

In accordance with at least one example of the description, a system includes a sensor IC, including a driver configured to produce an oscillating waveform, the driver including a first transistor and a second transistor. The sensor IC also includes an amplitude control amplifier coupled to the first transistor and configured to adjust a differential output voltage value of the oscillating waveform. The sensor IC includes a common mode control amplifier coupled to the second transistor and configured to adjust an average voltage value of the oscillating waveform. The sensor IC also includes a handover control circuit coupled to the amplitude control amplifier, wherein the handover control circuit includes a resistor network coupled to a switch network, and wherein the handover control circuit is configured to repeatedly step down a preset reference voltage provided to the amplitude control amplifier.

In accordance with at least one example of the description, a method includes providing a preset reference voltage to an amplitude control amplifier in a sensor IC. The method also includes providing an output of the amplitude control amplifier to a driver of an oscillator to adjust an amplitude of the oscillator. The method includes reducing the preset reference voltage provided to the amplitude control amplifier in a series of steps. The method also includes responsive to completing the series of steps, turning off the driver.

BRIEF DESCRIPTION OF THE DRAWINGS

For a detailed description of various examples, reference will now be made to the accompanying drawings in which.

The same reference numbers and/or other reference designators are used in the drawings to designate the same or similar (functionally and/or structurally) features.

DETAILED DESCRIPTION

Some applications and/or systems (such as automotive and industrial applications) may use redundant systems to meet high safety and reliability requirements. For example, a sensor coupled to a sensor integrated circuit (IC) and an electronic control unit (ECU) may monitor an angular position of a motor shaft. The sensor IC receives data from the sensor, processes the data, and forwards the processed data to the ECU. In one application, the motor shaft is part of a steering wheel in an automobile, so the sensor monitors a position of a steering wheel. In another example, the sensor monitors an angular position of an accelerator pedal to determine how far the pedal is depressed. In other examples, the angular position of a robotic component is monitored. Monitoring these types of components is important for safety-critical applications. The ECU analyzes the data from these sensors and other sensors and then determines whether appropriate emergency actions should be taken.

Because these sensors provide data for critical safety requirements, redundant sensors and sensor ICs are useful. With redundant sensors and sensor ICs, two (or more) sensors monitor the same attribute of the system, such as the angular position of a component. If both sensors and sensor ICs are operational, the ECU cross-checks the accuracy of one sensor with the other. If a first sensor or sensor IC fails, experiences a fault, or undergoes a self-checking diagnostic, the second sensor and its sensor IC continue to provide feedback to the ECU, so normal operation of the critical safety system is maintained. The two sensors and their sensor ICs are nominally identical. In one scenario, angular position is determined using a dual-oscillator system with two sensors working in parallel. Each sensor IC has its own oscillator driver circuit and an external LC (inductor-capacitor) tank. The external inductors of the LC tanks are strongly coupled by design. During normal operation, the sensor ICs may share the total LC tank load. However, due to process variation or manufacturing mismatch, one sensor IC may have driver circuitry that is stronger than the other sensor IC's driver circuitry. The stronger sensor IC may therefore take a larger share of the LC load. If the stronger sensor IC needs to shut down for diagnostics or experiences a fault that provides a shutdown request or notification, the entire LC load may be quickly transferred to the weaker sensor IC, which may be unable to handle the sudden load. The weaker sensor IC may then experience a fault and shut down, which means both sensors ICs will be off simultaneously. This scenario breaks the redundancy built into the dual-sensor system, and the ECU will not receive critical safety information during the time period when both sensor ICs are shut down.

In examples herein, instead of turning a sensor IC off immediately (e.g., for diagnostics), a soft handover procedure is performed first. In the soft handover procedure, an oscillator amplitude control reference voltage within a first sensor IC may be gradually reduced, step-by-step, to ensure that the LC load is transferred gradually to the driver within the second sensor IC of the dual-sensor system. In one example, a digital controller manages a series of switches (e.g., a switch network) and a resistor network to perform the step-by-step reduction in the amplitude control reference voltage. After the LC load is transferred to the second sensor IC, the first sensor IC is safe to shut down and perform any diagnostics or reset procedures. The redundant operation of the dual-sensor system is therefore maintained, and safety-critical information may be continually provided to the ECU.

Figure 1:
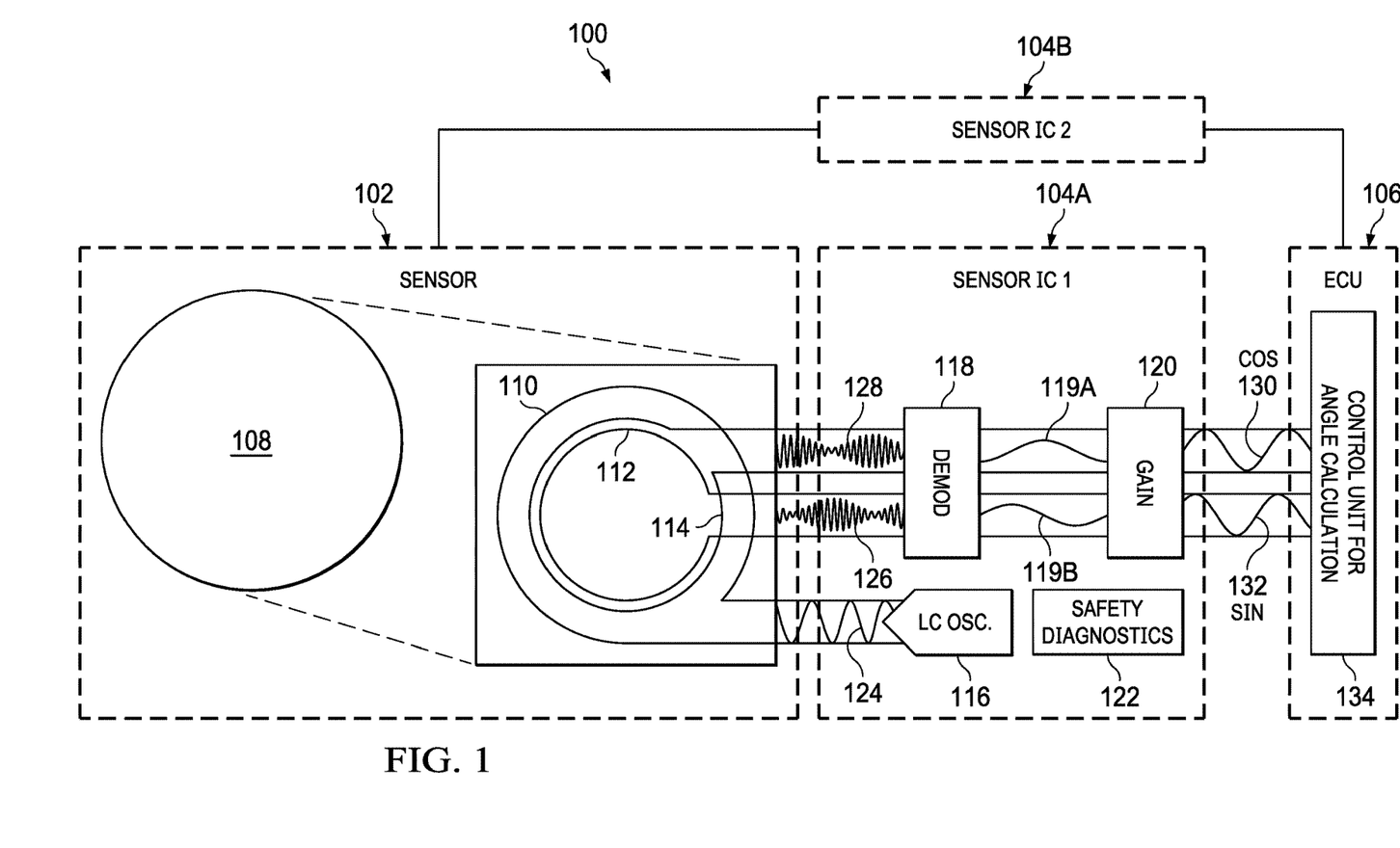
FIG. 1 is a block diagram of a system for dual angular position sensors in accordance with various examples.

FIG. 1 is a diagram of a system 100 for dual angular position sensors in accordance with various examples herein. In other examples, other types of sensors besides angular position sensors may be used. System 100 includes a sensor 102, sensor ICs 104A and 104B (collectively, sensor ICs 104), and ECU 106. Rotor 108 is shown with sensor 102, and rotor 108 is the component being monitored for angular position. Sensor 102 includes an excitation coil 110, a first pickup coil 112, and a second pickup coil 114. Sensor IC 104A includes an LC oscillator 116, a demodulator 118, a gain module 120, and a safety diagnostics module 122. System 100 generates and/or receives signals 124, 126, 128, 130, and 132. ECU 106 includes control unit 134, which may perform an angle calculation of the rotor 108 based on data from sensor 102 and sensor ICs 104.

System 100 is an example of a redundant system. System 100 includes sensor IC 104B, which is nominally identical to sensor IC 104A. The internal components of sensor IC 104B may be similar (or the same) as components of sensor IC 104A and are not shown for simplicity. In addition, just as sensor IC 104A drives its associated sensor 102, sensor IC 104B drives its own associated sensor (a second sensor separate from sensor 102), which includes the same type or similar type of coils as sensor 102 (coils 110, 112, and 114). The coils for the second sensor are situated closely to the coils for sensor 102, and are also omitted from FIG. 1 so the coils for sensor 102 may be seen clearly in FIG. 1. The coils for the second sensor operate similarly to coils 110, 112, and 114, which are described below. As described above, if one sensor IC 104 fails or resets for some reason, the other sensor IC 104 may continue to operate to deliver angle information to ECU 106.

In an example operation of system 100, the rotor 108 rotates on an axis. In some examples, a metal target may be attached to rotor 108. The metal target rotates with rotor 108. Excitation coil 110 is driven by LC oscillator 116 (which may be implemented as other types of oscillators in other example embodiments). LC oscillator 116 excites the excitation coil 110 with a current that flows through excitation coil 110. The current has a known frequency, which acts as a carrier frequency for the signal on pickup coils 112 and 114. Signal 124 is produced by LC oscillator 116 in this example and provided to excitation coil 110. Pickup coils 112 and 114 may be wound out of phase from one another (in this example by 90 degrees). Therefore, in one example, one pickup coil produces a signal in the form of a sine wave, while the other pickup coil produces a signal in the form of a cosine wave, which are out of phase from one another by 90 degrees.

As rotor 108 rotates, an electromotive force is induced in pickup coils 112 and 114. Each pickup coil 112 and 114 produces a signal, shown in FIG. 1 as signals 126 and 128 (which are not necessarily depicted to scale, regarding amplitude and/or frequency, in FIG. 1). As seen in FIG. 1, signals 126 and 128 are out of phase with one another by 90 degrees. Signals 126 and 128 may have a carrier frequency provided by signal 124 in excitation coil 110. The carrier frequency of signal 124 is known, and can be removed from signal 126 and 128 by demodulator 118. Gain module 120 may add gain to the two signals 119A and 119B produced by demodulator 118. Gain module 120 produces cosine wave 130 and sine wave 132 as shown in FIG. 1, which may be single ended or differential, and provides those signals to ECU 106. The angular position of rotor 108 is determined by cosine wave 130 and sine wave 132. Control unit 134 may perform the angle calculation and determine the angular position of rotor 108. Then, depending on the angular position, ECU 106 may take an appropriate action in some circumstances.

System 100 is a redundant sensor system, so the second sensor and sensor IC 104B may operate similarly to first sensor 102 and sensor IC 104A, respectively. Sensor IC 104B may also provide sine and cosine wave signals to ECU 106. ECU 106 may determine angular position from each of the sensors, and may check the angular position provided from one sensor against the other sensor. If one sensor or sensor IC fails, the other may act as a failsafe to continue delivering angular position information to ECU 106.

An angular position sensor such as system 100 is often used in a safety critical application. For example, a position of a steering wheel in an automobile is information that may be important to know at all times. A delay of even a few milliseconds may be harmful in some circumstances. In examples herein, a soft handover procedure may be performed when a sensor IC 104 has to shut down. The details of the soft handover procedure are described below with respect to FIGS. 3A, 3B, and 4. Each sensor IC 104 may include circuitry, along with other appropriate hardware and/or software, to perform the soft handover procedure to handover the operation of the system to another sensor IC 104 in a manner that ensures at least one sensor 102 and sensor IC 204 are operating at all times. Therefore, gaps in the sensor information provided to the ECU 106 may be reduced or eliminated in examples described herein.

In some example embodiments, ECU 106 includes a processor, logic circuitry, a state machine and/or other circuitry. ECU 106 may also include software and memory in other example embodiments. Gain stage 120 may include one or more amplifiers and/or feedback loops. LC oscillator 116 may be implemented using internal or external inductor(s)/capacitor(s) or may be implemented using other circuitry (e.g., a bulk acoustic wave oscillator). Demodulator 118 may be implemented using analog or digital filters (such as low pass, high pass or band pass filters) and/or may utilize the output of oscillator 116 to demodulate signals 126 and 128.

Figure 2:
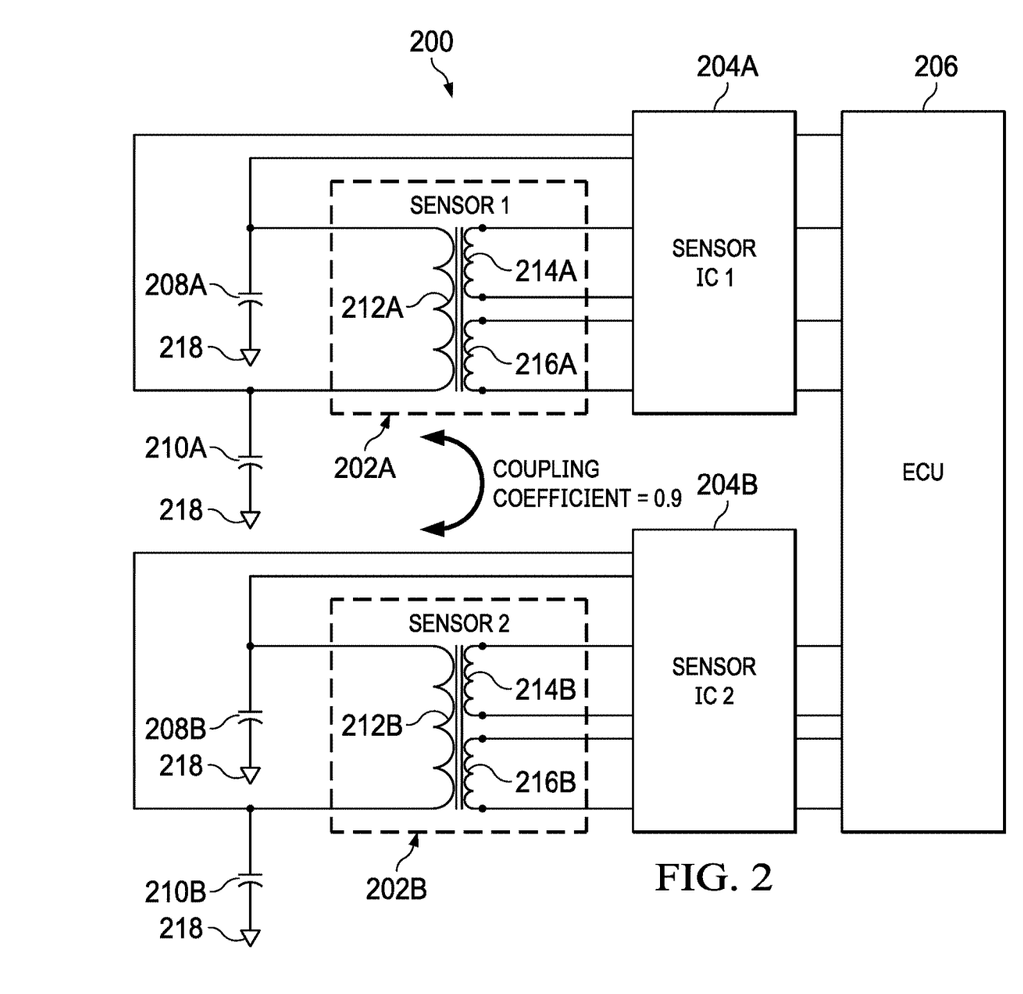
FIG. 2 is a block diagram of a system for dual angular position sensors in accordance with various examples.

FIG. 2 is a diagram of a system 200 for dual angular position sensors in accordance with various examples herein. FIG. 2 includes many of the same components described above with respect to FIG. 1. System 200 includes sensor 202A, sensor 202B (collectively, sensors 202), sensor IC 204A, sensor IC 204B (collectively, sensor ICs 204), and ECU 206. Sensor IC 204A manages an LC tank composed of capacitors 208A, 210A, and inductor 212A. Sensor IC 204A also manages pickup coils 214A and 216A. Capacitors 208A and 210A are coupled to common potential (e.g., ground) 218.

Sensor IC 204B manages an LC tank composed of capacitors 208B, 210B, and inductor 212B. Sensor IC 204B also manages pickup coils 214B and 216B. Capacitors 208B and 210B are coupled to ground 218.

The LC tank and pickup coils 214 and 216 may operate similarly to the LC tank and pickup coils 112 and 114 described above with respect to FIG. 1. The sensors 202, sensor ICs 204, and ECU 206 may operate similarly to sensor 102, sensor IC 104, and ECU 106 described above with respect to FIG. 1. Referring again to FIG. 2, the sensor inductors of LC tanks of sensor 202 may be situated physically close to one another, which creates a high coupling coefficient between the LC tanks. In one example, the oscillators are inductively coupled to one another with a coupling coefficient of 0.9, or 90%. The coupling coefficient may be higher or lower in other examples.

Manufacturing of sensors may lead to minute differences in the sensor (such as in the inductors 212, the capacitors 208 and 210, and/or the coils 214 and 216) and/or in the sensor ICs 204. Because of these differences, either of sensor 202A or sensor 202B may be stronger than the other. Similarly, either of sensor IC 204A or sensor IC 204B may be stronger than the other. During operation, the stronger sensor 202 and sensor IC 204 may handle the majority of the LC load (e.g., a higher current and/or a higher voltage may be applied to the stronger sensor 202/sensor IC 204). In alternative solutions, a problem may occur if the stronger sensor IC 204 has to shut down. If there is a fault with a sensor IC 204, elaborate diagnostics are performed on the sensor IC 204 to maintain safety. If a diagnostic fails, the sensor IC 204 may go through a startup and built-in self-test (BIST) procedure. This procedure takes time, so ECU 206 uses the other sensor IC 204 while the first sensor IC 204 is starting up. If the weaker sensor IC 204 undergoes a fault, the stronger sensor IC 204 may generally handle the load. However, if the stronger sensor IC 204 shuts down, the entire load may immediately shift to the weaker sensor IC 204. The weaker sensor IC 204 may not be able to handle the load, and then it may go into a fault status as well.

Therefore, in examples herein, each sensor IC 204 includes circuitry, along with other appropriate hardware and/or software, to perform the soft handover procedure to handover the operation of the system to another sensor IC 204 in a manner that ensures at least one sensor 202 and sensor IC 204 are operating at all times. Therefore, gaps in the sensor information provided to the ECU 206 may be reduced or eliminated in examples described herein. The details of the soft handover procedure are described below with respect to FIGS. 3A, 3B, and 4.

Figure 3A:
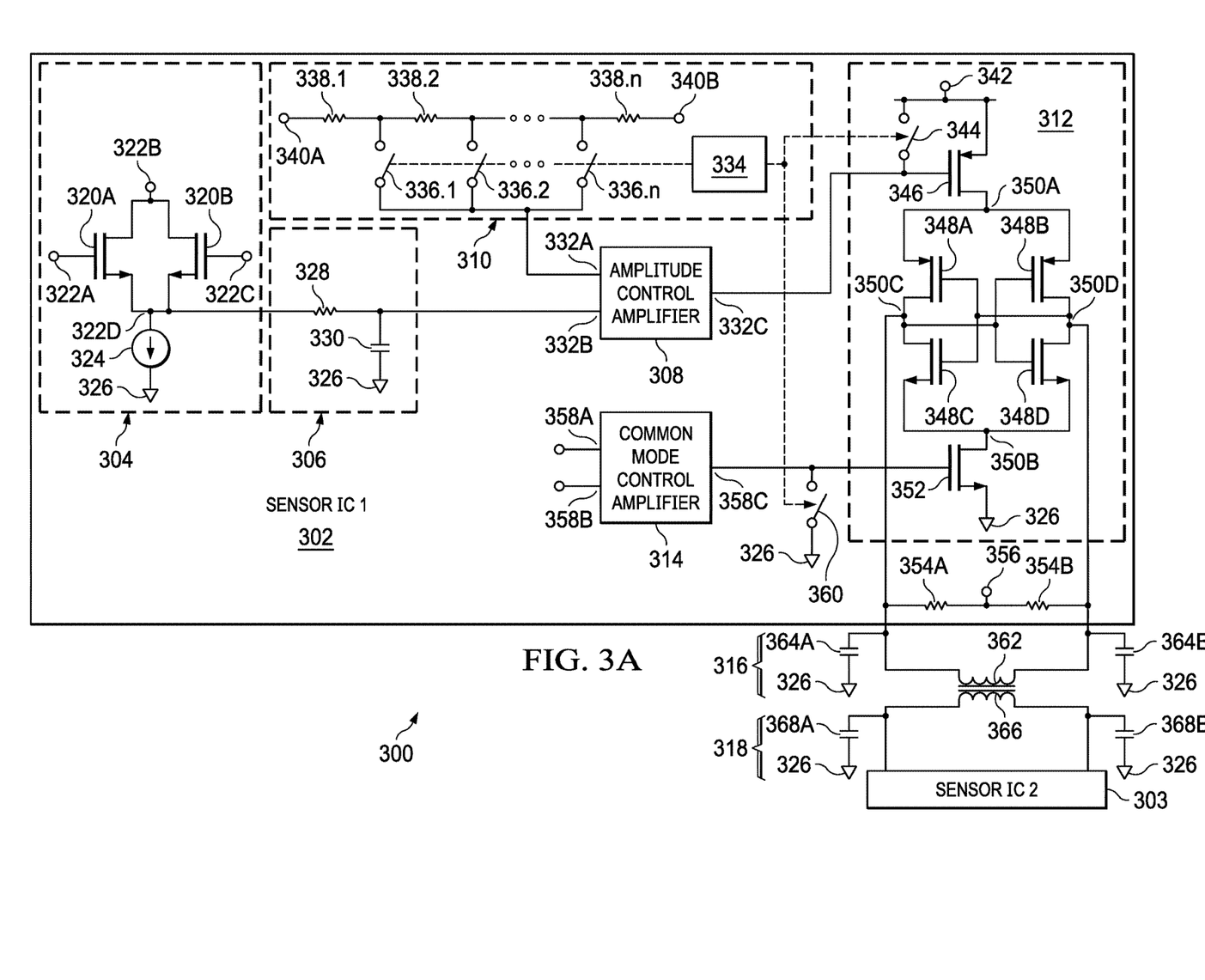
FIG. 3A is a circuit diagram of a system for a soft handover procedure in a dual oscillator system in accordance with various examples.

FIG. 3A is a diagram of a system 300 for a soft handover procedure in a dual oscillator system according to various examples herein. System 300 includes a first sensor IC 302 and a second sensor IC 303, which each have an oscillator that couples the sensor ICs 302 and 303 to one another via mutual inductance. FIG. 3A shows the details of sensor IC 302. The details of sensor IC 303 are described below with respect to FIG. 4. However, sensor IC 302 and sensor IC 303 are nominally identical in this example (due to the redundancy of the implementation), so the description of the components and operation of sensor IC 302 in FIG. 3A also apply to sensor IC 303 shown in FIG. 4.

System 300 includes an amplitude detector 304, an RC filter 306, an amplitude control amplifier 308, a soft handover control circuit 310, a driver 312, a common mode control amplifier 314, and an LC oscillator 316. These components and/or portions of these components may be located inside or outside of sensor IC 302 (e.g., on a single semiconductor substrate, on multiple substrates in a single semiconductor device package or on multiple substrates and within multiple semiconductor device packages), a sensor, or an ECU. FIG. 3A also shows the second sensor IC 303 and its LC oscillator 318.

Amplitude detector 304 includes transistors 320A and 320B, nodes 322A, 322B, 322C, and 322D, and current source 324 coupled to common potential (e.g., ground) 326. RC filter 306 includes resistor 328 and capacitor 330, which is coupled to ground 326. Amplitude control amplifier 308 includes first input 332A, second input 332B, and output 332C. Soft handover control circuit 310 includes digital controller 334, switches 336.1, 336.2, . . . 336.n (collectively, switches 336), resistors 338.1, 338.2, . . . 338.n (collectively, resistors 338), and nodes 340A and 340B.

Driver 312 includes $V_{cc}$ node 342, switch 344, transistor 346, transistors 348A, 348B, 348C, and 348D, nodes 350A, 350B, 350C, and 350D, transistor 352, resistors 354A and 354B, and node 356. Common mode control amplifier 314 includes first input 358A, second input 358B, and output 358C. System 300 also includes switch 360. LC oscillator 316 includes inductor 362 and capacitors 364A and 364B. LC oscillator 318, coupled to sensor IC 303, includes inductor 366 and capacitors 368A and 368B.

As an overview of the operation of system 300, driver 312 drives LC oscillator 316 to produce an oscillating waveform. A first control loop that includes amplitude detector 304, amplitude control amplifier 308, and transistor 346 may control the amplitude of the differential output voltage of driver 312, which is realized at nodes 350C and 350D, and is provided to LC oscillator 316. A second control loop that includes common mode control amplifier 314 and transistor 352 may control the average of the differential output voltage of driver 312. These control loops may provide a stable output voltage oscillating waveform to LC oscillator 316 that operates within suitable operating parameters. In addition, system 300 includes soft handover control circuit 310. Soft handover control circuit 310 uses a series of resistors and switches to reduce a reference voltage, step-by-step, provided to amplitude control amplifier 308, in order to deliberately transfer the load to another sensor IC (in this case, sensor IC 303). The detailed operation of system 300 is described below.

In system 300, amplitude detector 304 includes transistor 320A and 320B. In one example, transistor 320A and 320B are field effect transistors (FETS), and may be metal-oxide semiconductor FETs (MOSFETs) in some examples. Transistors 320A and 320B may be n-channel FETS in one example. A drain of transistor 320A is coupled to node 322B, which provides a supply voltage such as $V_{cc}$ in one example. A drain of transistor 320B is also coupled to node 322B. A source of transistor 320A and a source of transistor 320B are coupled to node 322D, which is coupled to current source 324. Current source 324 is also coupled to common potential (e.g., ground) 326. A gate of transistor 320A is coupled to node 350C via node 322A, which is the positive terminal of the differential output voltage provided by driver 312. A gate of transistor 320B is coupled to node 350D via node 322C, which is the negative terminal of the differential output voltage provided by driver 312. Therefore, the differential output voltage of driver 312 (at nodes 350C and 350D) is provided to nodes 322A and 322C. Current from current source 324 is directed to either transistor 320A or 320B, depending on which gate signal (node 322A or node 322C) is higher. The signal at node 322D follows the higher gate signal. In this example, amplitude detector 304 receives the differential output voltage from driver 312 (via nodes 350C and 350D) and detects the amplitude of the differential output voltage signal. Amplitude detector 304 provides a signal to RC filter 306 via node 322D.

Node 322D, which is coupled to the source of transistor 320A and the source of transistor 320B, is coupled to a first terminal of resistor 328 in RC filter 306. The second terminal of resistor 328 is coupled to capacitor 330, which is also coupled to ground. RC filter 306 may provide a low-pass filter to the signal from node 322D. The signal from node 322D is an estimation of the peak amplitude of the positive and negative voltage values of the differential output voltage of driver 312, provided at nodes 350C and 350D. This voltage amplitude is provided to second input 332B of amplitude control amplifier 308. The first input 332A of amplitude control amplifier 308 is a preset reference voltage. The preset reference voltage is the voltage that amplitude control amplifier 308 attempts to set the differential output voltage to. For example, if the differential output voltage of driver 312 is larger than the preset reference voltage at first input 332A, amplitude control amplifier 308 may drive the gate of transistor 346 to be higher via output 332C. A higher gate voltage at transistor 346 may reduce the current flowing into driver 312, which may decrease the oscillation of the differential output voltage to the preset reference voltage level at first input 332A. As another example, if the differential output voltage of driver 312 is smaller than the preset reference voltage at first input 332A, amplitude control amplifier 308 may drive the gate of transistor 346 to be lower via output 332C. A lower gate voltage at transistor 346 may increase the current flowing into driver 312, which may increase the oscillation of the differential output voltage to the preset reference voltage level at first input 332A.

Driver 312 includes transistor 346. A gate of transistor 346 is coupled to output 332C of amplitude control amplifier 308 and switch 344. A source of transistor 346 is coupled to $V_{cc}$ node 342, which may be coupled to a voltage supply $V_{cc}$. A drain of transistor 346 is coupled to node 350A. Transistor 346 is a p-channel FET in this example, but any suitable type of transistor may be used in other examples.

Driver 312 also includes transistors 348A, 348B, 348C, and 348D (collectively, transistors 348). Transistors 348 are cross-coupled and provide the differential output voltage of driver 312, which is realized at nodes 350C and 350D. In this example, transistors 348A and 348B are p-channel FETS, and transistors 348C and 348D are n-channel FETS. A source of transistor 348A and a source of transistor 348B are coupled to node 350A. A drain of transistor 348A is coupled to node 350C and a drain of transistor 348C. A drain of transistor 348B is coupled to node 350D and a drain of transistor 348D. A gate of transistor 348A is coupled to a gate of transistor 348C. A gate of transistor 348B is coupled to a gate of transistor 348D. A source of transistor 348C is coupled to node 350B and a drain of transistor 352. A source of transistor 348D is coupled to node 350B and a drain of transistor 352. A source of transistor 352 is coupled to ground 326, and a gate of transistor 352 is coupled to output 358C of common mode control amplifier 314 and switch 360. Transistor 352 may be an n-channel FET in one example.

Common mode control amplifier 314 may regulate the center level of the differential output voltage waveform (described below with respect to FIG. 3B). The common mode voltage represents the average output voltage value of the top and bottom voltage values of the differential output voltage waveform. In an example, the center level of the differential output voltage waveform may be kept near 50% of the voltage value of $V_{cc}$. If the common mode voltage level is too low, current through transistor 352 may be decreased by common mode control amplifier 314. If the common mode voltage level is too high, current through transistor 352 may be increased by common mode control amplifier 314. The actual common mode voltage output may be sensed at node 356 and provided to second input 358B of common mode control amplifier 314. The common mode voltage level may be compared to a common mode reference voltage provided to first input 358A of common mode control amplifier 314. Responsive to the comparison, common mode control amplifier 314 may raise or lower the output signal at output 358C to adjust the current through transistor 352, and thereby adjust the common mode voltage level.

Figure 3B:
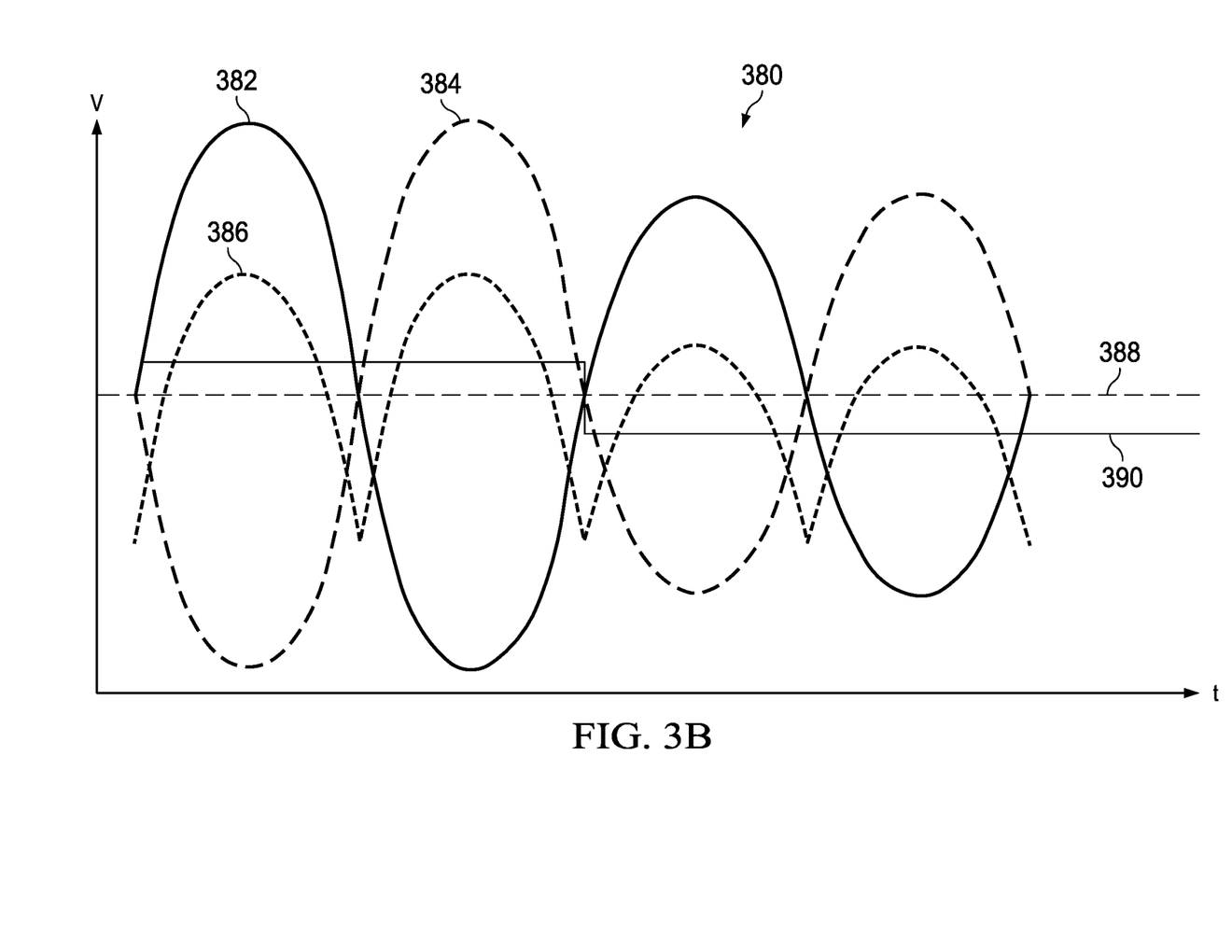
FIG. 3B are graphs of voltage waveforms (versus time) in accordance with various examples.

FIG. 3B are graphs 380 of voltage waveforms in system 300 in accordance with various examples herein. The y-axis represents voltage, and the x-axis represents time. Waveform 382 is the voltage waveform at the positive node of the differential output voltage, node 350C. Waveform 384 is the voltage waveform at the negative node of the differential output voltage, node 350D. Waveform 386 is the voltage waveform at node 322D in amplitude detector 304. Waveform 388 is the common mode voltage, which is the average of the voltage amplitude of the differential output voltage waveforms (waveform 382 and 384). In an example, the common mode control amplifier 314 may keep the value of waveform 388 near 50% of $V_{cc}$. Waveform 390 is the low pass filtered value of waveform 386, which is provided to amplitude control amplifier 308 at second input 332B. Amplitude control amplifier 308 may receive the differential output voltage represented by waveform 390 and drive the gate of transistor 346 higher or lower, as described above, so the differential output voltage matches the preset reference voltage at first input 332A of amplitude control amplifier 308. The preset reference voltage may be useful for performing the soft handover procedure in accordance with various examples herein.

In an example, when sensor IC 1 302 has to shut down because of a diagnostic failure, a soft hand over procedure may be initiated. Referring again to FIG. 3A, soft handover control circuit 310 may perform the soft handover by gradually reducing the preset reference voltage provided to first input 332A of amplitude control amplifier 308. This gradual reduction causes amplitude control amplifier to gradually reduce the current flowing through transistor 346 via output 332C, by reducing the gate-to-source voltage of transistor 346. As the current flowing through transistor 346 drops, the differential amplitude of the output LC oscillations of driver 312 drops gradually as well. Because LC oscillator 316 is tightly coupled to LC oscillator 318, as the oscillations of LC oscillator 316 drop, LC oscillator 318 may gradually take more of the load. Therefore, the load may be transferred gradually from sensor IC 1 302 to sensor IC 2 303, without a complete loss of operation of the sensors as occurs in the conventional systems. After the load is fully transferred to sensor IC 2 303, sensor IC 1 302 may shut off and perform diagnostics or other operations before resuming operation.

Soft handover control circuit 310 includes digital controller 334, switches 336, and resistors 338. Resistors 338 are coupled between nodes 340A and 340B. Node 340A is coupled to a positive terminal of a reference voltage, and node 340B is coupled to a negative terminal of a reference voltage. The voltage difference between nodes 340A and 340B may be based on $V_{cc}$. If the voltages are not trimmed as described below, the voltage difference between nodes 340A and 340B may be near or equal to $V_{cc}$, which may be 3.3 V in one example. However, if the reference voltage is trimmed as described below, the voltage between nodes 340A and 340B may be less than $V_{cc}$, such as 80% or 60% of $V_{cc}$. One switch 336 is closed during normal operation to provide the appropriate reference voltage to amplitude control amplifier 308 via first input 332A. During the soft handover procedure, switches 344 and 360 are kept open. Keeping switches 344 and 360 open maintains the amplitude control loop and the common mode control loop until the soft handover procedure is complete. The soft handover procedure involves digital controller 334 selecting one switch 336 from the switch network and closing it, while leaving the other switches 336 open. The first selected switch 336 may be the switch 336 used during normal operation or may be a different switch 336. For example, switch 336.1 may be closed during the first step, while the other switches 336 remain open. Then, after a predetermined time interval, switch 336.2 is closed, and the other switches 336 are opened, including switch 336.1. The switches 336 may be closed one at a time until the steps are complete. In this manner, the value of the reference voltage provided to input 332A of amplitude control amplifier 308 may be reduced gradually, step-by-step, which may gradually lower the differential output voltage from driver 312 and gradually transfer the load to LC oscillator 318 of the second sensor.

In another example, in order to minimize differential amplitude voltage variations because of manufacturing tolerances, the digital controller may be "trimmed," preset, or forced to have a certain switch 336 closed (for example, switch 336.2 is closed and other switches 336 are open). In such a case, when a soft handover procedure is initiated, the controller starts from that "trimmed," preset, or pre-determined closed switch 336 position and then gradually reduces the reference voltage as described above.

Any number of steps may be included for the soft handover procedure. In one example, the reference voltage is reduced in 32 steps. Each step reduces the voltage by a preset value, such as 25 mV. The voltage reduction per step may be programmed to any suitable value via setting the value of resistors 338. The step time duration for each step may also be programmed to any suitable value. In some examples, the switches 336 are switched by digital controller 334 every 25 microseconds. In other examples, the step time duration may be shorter or longer. The step time is set to an appropriate value to allow the amplitude control loop enough time to respond and settle, and to allow the load to be successfully transferred to LC oscillator 318.

After the reference voltage provided by the soft handover control circuit 310 reaches the lowest value provided by the steps, LC oscillator 316 may be the weaker side in the dual sensor system. At this time, sensor IC 1 302 may be shut down or undergo any diagnostics as needed. To shut off LC oscillator 316 completely, after the steps of the soft handover procedure are complete, switches 344 and 360 may be closed via signals from digital controller 334. Closing switches 344 and 360 may stop current flowing through driver 312 and shut off LC oscillator 316.

Performing the soft handover procedure makes LC oscillator 316 gradually become the weaker oscillator between LC oscillator 316 and LC oscillator 318 in one example. Because sensor IC 2 303 has similar circuitry as sensor IC 1 302, the control loops within sensor IC 2 303 gradually push more current to LC oscillator 318 to handle the load during the soft handover procedure. After the soft handover procedure, LC oscillator 318 may become the stronger oscillator, if it previously was the weaker one. LC oscillator 318 will remain operating and not be affected by the shutoff or reset of LC oscillator 316.

In examples herein, the soft handover procedure is performed by either sensor IC 302 or 303 when the sensor IC is to be shut down, no matter which sensor IC is stronger. The system described herein is a dual-sensor system with redundant systems, so sensor IC 1 302 and sensor IC 2 303 may be identical or nearly identical. In alternative embodiments, more sensors and sensor IC's may be utilized in a similar manner.

Figure 4:
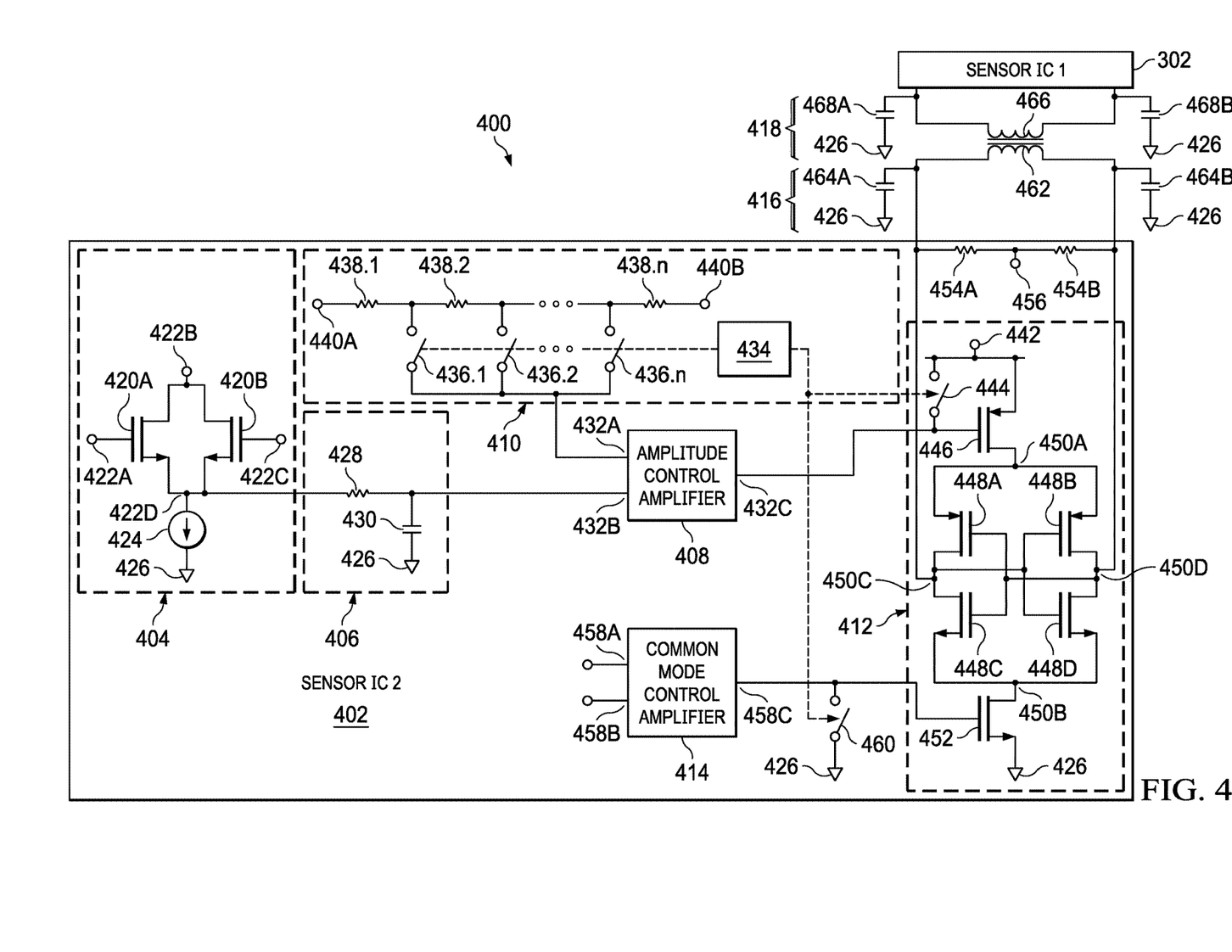
FIG. 4 is a circuit diagram of a system for a soft handover procedure in a dual oscillator system in accordance with various examples.

FIG. 4 is a diagram of a system 400 for a soft handover procedure in a dual oscillator system according to various examples herein. System 400 includes the details of second sensor IC 402, which couples to sensor IC 1 302 via mutual inductance. Second sensor IC 402 is sensor IC 2 303 as shown in FIG. 3A. Because sensor IC 302 and sensor IC 402 are nominally identical in this example (due to the redundancy of the implementation), the description of the components and operation of sensor IC 402 in FIG. 4 is identical or nearly identical to the description of sensor IC 1 302 with respect to FIGS. 3A and 3B above.

System 400 includes an amplitude detector 404, an RC filter 406, an amplitude control amplifier 408, a soft handover control circuit 410, a driver 412, a common mode control amplifier 414, and an LC oscillator 416. These components and/or portions of these components may be located inside or outside of sensor IC 402 (e.g., on a single semiconductor substrate, on multiple substrates in a single semiconductor device package or on multiple substrates and within multiple semiconductor device packages), a sensor, or an ECU. FIG. 4 also shows the first sensor IC 302 and its LC oscillator 418.

Amplitude detector 404 includes transistors 420A and 420B, nodes 422A, 422B, 422C, and 422D, and current source 424 coupled to common potential (e.g., ground) 426. RC filter 406 includes resistor 428 and capacitor 430, which is coupled to ground 426. Amplitude control amplifier 408 includes inputs first input 432A, second input 432B, and output 432C. Soft handover control circuit 410 includes digital controller 434, switches 436.1, 436.2, . . . 436.n (collectively, switches 436), resistors 438.1, 438.2, . . . 438.n (collectively, resistors 438), and nodes 440A and 440B.

Driver 412 includes $V_{cc}$ node 442, switch 444, transistor 446, transistors 448A, 448B, 448C, and 448D, nodes 450A, 450B, 450C, and 450D, transistor 452, resistors 454A and 454B, and node 456. Common mode control amplifier 414 includes first input 458A, second input 458B, and output 458C. System 400 also includes switch 460. LC oscillator 416 includes inductor 462 and capacitors 464A and 464B. LC oscillator 418, coupled to sensor IC 302, includes inductor 466 and capacitors 468A and 468B.

The description of first sensor IC 302 above with respect to FIGS. 3A and 3B also applies to sensor IC 402 shown in FIG. 4. Sensor IC 402 includes soft handover control circuit 410, which performs a soft handover procedure similar to soft handover control circuit 310 as described above.

Figure 5A:
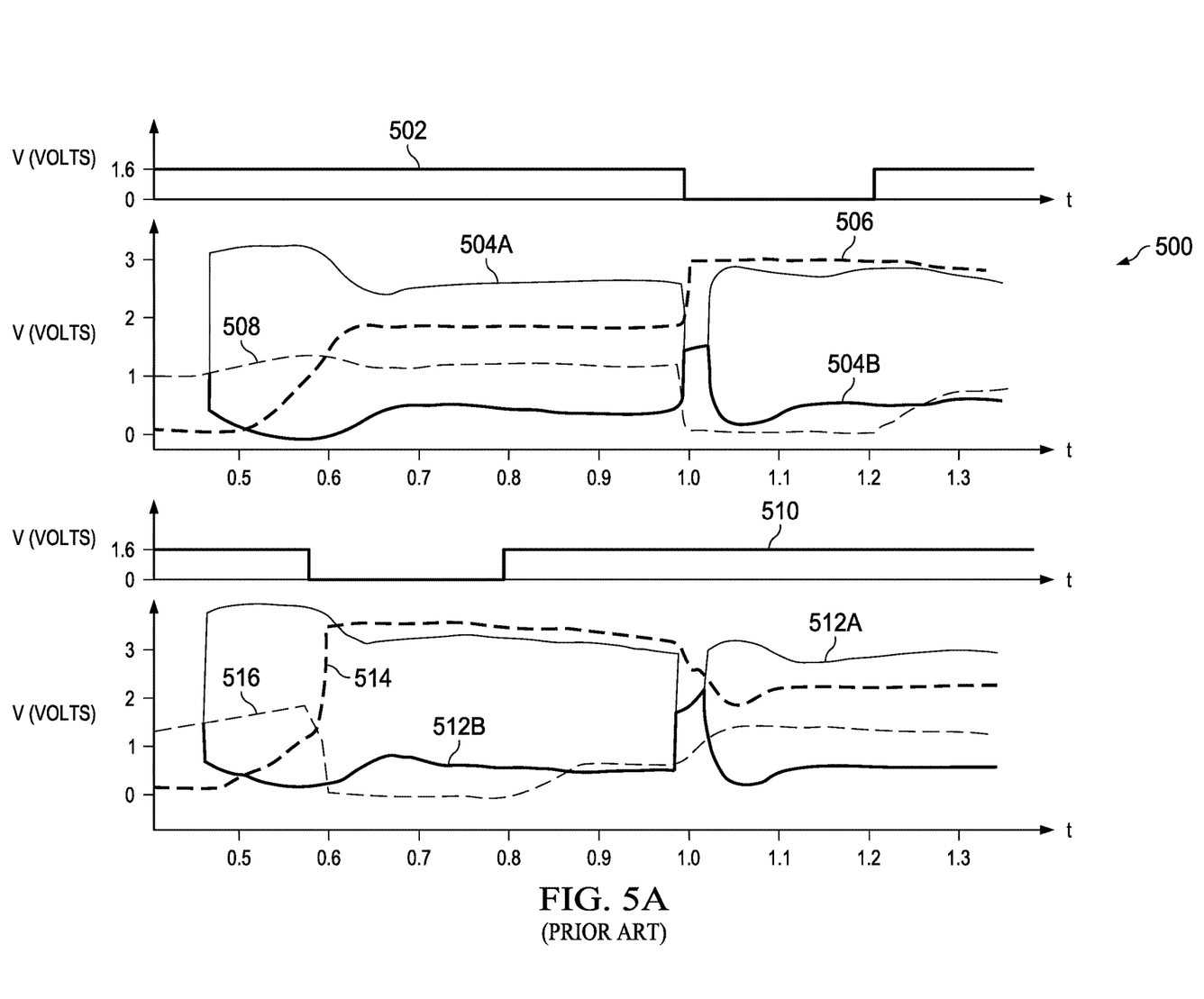
FIG. 5A are graphs of voltage waveforms (versus time) in a dual oscillator system in accordance with various examples.
Figure 5B:
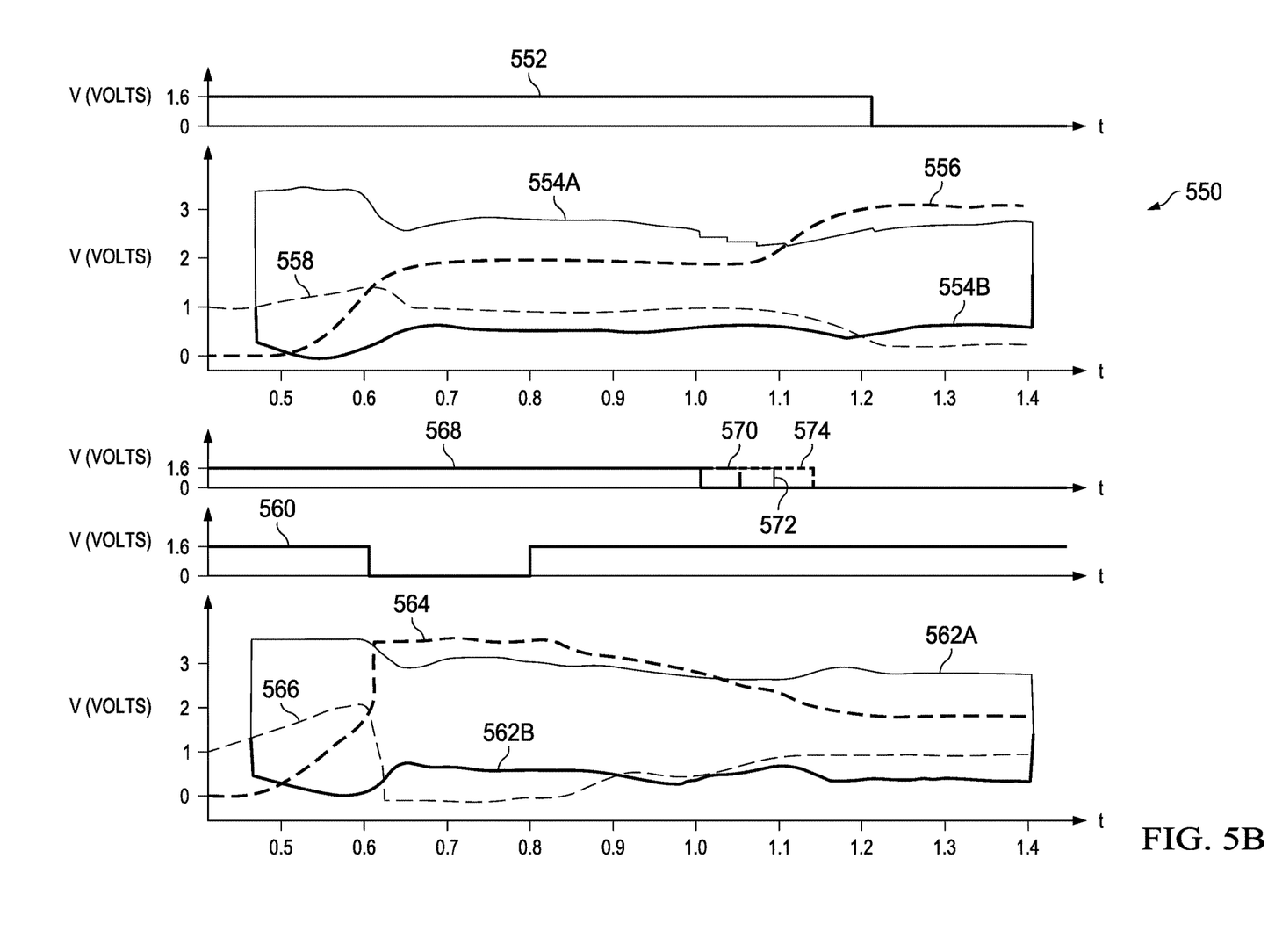
FIG. 5B are graphs of voltage waveforms (versus time) in a dual oscillator system in accordance with various examples.

FIGS. 5A and 5B are graphs 500 of voltage waveforms in a dual oscillator system in accordance with various examples herein. FIG. 5A includes waveforms in a conventional system without soft handover control circuitry. The top two graphs in FIG. 5A are waveforms corresponding to a first oscillator, while the bottom two graphs in FIG. 5A are waveforms corresponding to a second oscillator that is coupled to the first oscillator. Curves 502, 504A, 504B, 506, and 508 are waveforms of the first oscillator and first sensor. Curves 510, 512A, 512B, 514, and 516 are waveforms of the second oscillator and second sensor. The x-axes of the graphs represent time in milliseconds, while the y-axes represent voltage in volts.

Curves 504A and 504B represent the upper and lower bounds of the first oscillator in the first sensor, respectively. The individual oscillations are not shown for simplicity, but the output voltage of the first oscillator oscillates between 504A and 504B. Curves 512A and 512B represent the upper and lower bounds of the second oscillator in the second sensor, respectively. The output voltage of the second oscillator oscillates between 512A and 512B.

Curve 506 represents the gate voltage of a transistor in a driver for the first sensor, such as transistor 346, which is the differential amplitude loop control voltage. Curve 508 represents the common mode loop control voltage for the first sensor, such as the gate voltage of transistor 352. Curve 514 represents the gate voltage of a transistor in a driver for the second sensor, such as transistor 446, which is the differential amplitude loop control voltage. Curve 516 represents the common mode loop control voltage for the second sensor, such as the gate voltage of transistor 452. In FIG. 5A, the waveforms represent a system without a soft handover control circuit, so the oscillations of the first sensor and the second sensor may fall to zero at certain instances, as described below.

Curve 510 represents a control signal that turns off the second oscillator. At time 0.6 ms, the second oscillator is turned off. At time 0.6 ms, the first oscillator becomes the main driver for the LC tank, and the second oscillator acts as a passive load. At time 0.6 ms, curve 514 is pulled up close to $V_{cc}$ (e.g., 3.3 V). Curve 514 is the gate of a transistor such as transistor 446. Pulling the gate of transistor 446 up close to $V_{cc}$ shuts off transistor 446, which stops the current flowing into driver 412. At time 0.6 ms, the common mode voltage of the second sensor represented by curve 516 drops close to 0.

At time 0.8 ms, curve 510 goes high, which turns driver 412 for the second sensor IC 402 back on. At that time, the second LC oscillator 416 turns on and operates as the weaker oscillator of the coupled oscillators.

At time 1.0 ms, curve 502 goes low. Curve 502 represents a control signal that turns off the first oscillator. At time 1.0 ms, the first oscillator is turned off. At that time, curve 506 is pulled up close to $V_{cc}$ (e.g., 3.3 V). Curve 506 is the gate of a transistor such as transistor 346 in the first driver 312. At the same time, the common mode voltage of the second sensor represented by curve 508 drops close to 0.

As seen in curves 504A and 504B, the oscillations of the first oscillator stop completely for a short time after 1.0 ms. At that time, the first oscillator was the stronger oscillator. Because no soft handover procedure was performed, the oscillations also stop completely in the second oscillator at 1.0 ms, as represented by curves 512A and 512B. FIG. 5A therefore illustrates that without a soft handover procedure, the oscillations of the LC oscillators may stop completely for a time. At those times, no sensor information is being collected and sent to the ECU 106. For safety critical applications, the gap of time where no sensor information is being collected may cause serious problems.

After 1.1 ms, the second oscillator takes the load and normal operation resumes. As seen with curves 512A, 512B, 514, and 516, the second oscillator is handling the load after this time. Curve 516 shows that the gate voltage of transistor 452 is around 1.2 V. Curve 514 shows that the gate voltage of transistor 446 is around 2.2 V. With a $V_{cc}$ of approximately 3.3 V, curves 516 and 514 show that driver 412 is handling the load. After time 1.1 ms, curve 506 in the first sensor is close to $V_{cc}$ (3.3 V), which means that the gate-to-source voltage of transistor 346 in sensor IC 1 302 is low, and curve 508 is close to zero, therefore the first oscillator in system 300 is not handling the bulk of the load.

FIG. 5B includes waveforms in a system that includes soft handover control circuitry in accordance with various examples herein. The top two graphs in FIG. 5B are waveforms corresponding to a first oscillator, while the bottom two graphs in FIG. 5B are waveforms corresponding to a second oscillator that is coupled to the first oscillator. The center graph represents digital bits in soft handover control circuit 310 that control switches 336. Curves 552, 554A, 554B, 556, and 558 are waveforms of the first oscillator and first sensor. Curves 560, 562A, 562B, 564, and 566 are waveforms of the second oscillator and second sensor. Curve 568 is a waveform that represents digital bits for the soft handover control circuit 310, and includes digital bits 570, 572, and 574 as examples. The x-axes of the graphs represent time in milliseconds, while the y-axes represent voltage in volts.

Curves 554A and 554B represent the upper and lower bounds of the first oscillator in the first sensor, respectively. The individual oscillations are not shown for simplicity, but the output voltage of the first oscillator oscillates between 554A and 554B. Curves 562A and 562B represent the upper and lower bounds of the second oscillator in the second sensor, respectively. The output voltage of the second oscillator oscillates between 562A and 562B.

Curve 556 represents the gate voltage of a transistor in a driver for the first sensor, such as transistor 346, which is the differential amplitude loop control voltage. Curve 558 represents the common mode loop control voltage for the first sensor, such as the gate voltage of transistor 352. Curve 564 represents the gate voltage of a transistor in a driver for the second sensor, such as transistor 446, which is the differential amplitude loop control voltage. Curve 566 represents the common mode loop control voltage for the second sensor, such as the gate voltage of transistor 452. In FIG. 5B, the waveforms represent a system with a soft handover control circuit, so the oscillations of the first sensor and the second sensor do not fall to zero at any time.

Curve 560 represents a control signal that turns off the second oscillator. At time 0.6 ms, the second oscillator is turned off. At time 0.6 ms, the first oscillator becomes the main driver for the LC tank, and the second oscillator acts as a passive load. At time 0.6 ms, curve 564 is pulled up close to $V_{cc}$ (e.g., 3.3 V). Curve 564 is the gate voltage of a transistor such as transistor 446. Pulling the gate of transistor 446 up close to $V_{cc}$ shuts off transistor 446, which stops the current flowing into driver 412. At time 0.6 ms, the common mode voltage of the second sensor represented by curve 566 drops close to 0.

At time 0.8 ms, curve 560 goes high, which turns driver 412 for the second sensor IC 402 back on. At that time, the second LC oscillator 416 may turn on and operate as the weaker oscillator of the coupled oscillators.

At time 1.0 ms, the soft handover procedure begins to turn off the first oscillator, represented by the top two graphs of FIG. 5B. Curve 568 and digital bits 570, 572, and 574 represent the steps of the soft handover procedure as described above. During the soft handover procedure, the reference voltage amplitude provided by soft handover control circuit 310 to amplitude control amplifier 308 is reduced step-by-step. Reducing this reference voltage amplitude step-by-step allows sensor IC 1 302 to gradually transfer the load from the first LC oscillator 316 to the second LC oscillator 416 of system 400. The value of curve 556 represents the gate to source voltage of a transistor in a driver for the first sensor, such as transistor 346. After time 1.0 ms, curve 556 begins to rise toward $V_{cc}$ (e.g., about 3.3 V). This rising voltage reduces the current provided by driver 312. In addition, after time 1.0 ms, curve 558 drops toward 0 V. Curve 558 represents the common mode loop control voltage for the first sensor (system 300). The first oscillator is therefore taking less of the load after 1.0 ms.

After 1.0 ms, the second LC oscillator 416 and the control loops in second sensor IC 402 begin to take more of the load from the first LC oscillator 316. Curve 564 represents the gate voltage of transistor 446 in driver 412 for the second sensor IC 402, which is the differential amplitude loop control voltage. The drop in curve 564 after 1.0 ms may cause an increase in the amount of current driver 412 drives to second LC oscillator 416, and therefore second LC oscillator 416 may take more of the load from the first LC oscillator 316. Curve 566 rises after 1.0 ms, which represents the common mode loop control voltage for the second sensor IC 402, such as the gate voltage of transistor 452. The rise in curve 566 also shows that second LC oscillator 416 is taking more of the load. From 1.2 ms to 1.4 ms, the first LC oscillator 316 is turned off for reset and/or diagnostics, and the second LC oscillator 416 is in operation and handling the load. In contrast to FIG. 5A, the waveforms in FIG. 5B show that the oscillations do not drop to zero at any time during the handover procedure. Therefore, with a soft handover control circuit, at least one sensor remains operational during the handover procedure, and angle information or other safety critical information is continuously provided to the ECU.

Figure 6:
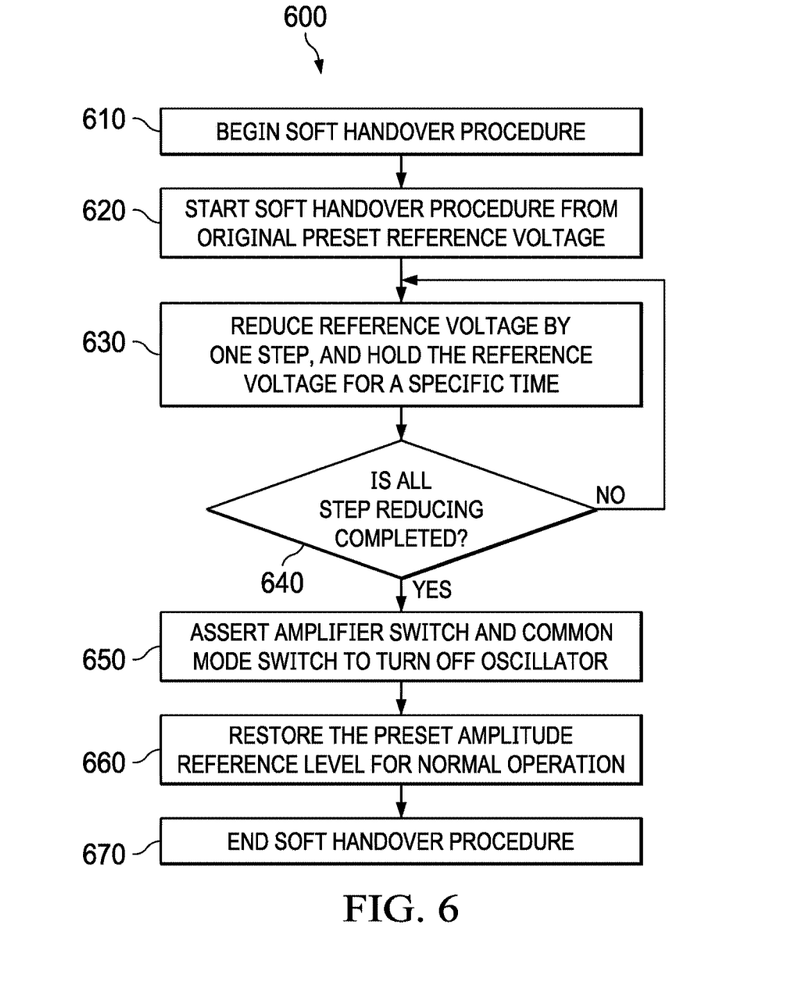
FIG. 6 is flow diagram of a method for a soft handover procedure in accordance with various examples.

FIG. 6 is a flow diagram of a method 600 for a soft handover procedure in accordance with various examples herein. The steps of method 600 may be performed in any suitable order. The hardware components described above with respect to FIGS. 1, 2, 3A, and 4 may perform method 600 in one example.

Method 600 begins at 610, where the soft handover procedure begins. At 620, the preset reference voltage may be provided by soft handover control circuit 310 to first input 332A of amplitude control amplifier 308. The soft handover procedure begins with the original value of the preset reference voltage. The original value may be a trimmed value in some examples. The trimmed voltage may be a voltage below the maximum voltage, and may be set and stored in a memory, such as non-volatile memory. For example, the preset reference voltage may be trimmed to 80% or 60% of $V_{cc}$, in order to compensate for process variations among different sensors. The common mode reference voltage (provided to common mode control amplifier 314 at first input 358A) may also be trimmed in some examples. Therefore, at 620, the soft handover procedure begins with the preset reference voltage, which may be a trimmed voltage in some examples.

Method 600 continues at 630, where the reference voltage is reduced by one step, and the new reference voltage is held for a specific time. In one example, the reference voltage may be reduced by 25 mV in the first step, and the reference voltage may be held at this step for 25 microseconds. In other examples, other step sizes may be useful, and other times for holding the reference voltage may be used. The values for the step size and holding time may be stored in memory, such as non-volatile memory. The values could be hardcoded in some examples.

Method 600 continues at 640, where it is determined whether all the steps of the step-reducing algorithm have been completed. If not, the process returns to step 630, where the reference voltage is reduced by another step (such as 25 mV), and the new reference voltage is held again for the specific time (such as 25 microseconds). If all the steps of the step-reducing algorithm have been completed, the method proceeds to 650.

Method 600 continues at 650, where an amplifier switch (such as switch 344) and a common mode switch (such as switch 360) may be asserted to turn off the oscillator (such as LC oscillator 316). In FIG. 3A, switch 344 is closed, which turns off transistor 346. Also, switch 360 is closed, which turns off transistor 352. Asserting these two switches turns off LC oscillator 316. If method 600 were performed on second sensor IC 402 of FIG. 4, switches 444 and 460 would be asserted.

Method 600 continues at 660, where the preset amplitude reference may be restored for normal operation. The amplitude reference may be reset to an initial value from 620. In one example, the initial value of the preset amplitude reference is the trimmed voltage value. The amplitude reference may be reset so the correct values are provided to the amplitude control loop and common mode control loop after the oscillator is restarted at the conclusion of the soft handover procedure.

Method 600 continues at 670, where the soft handover procedure ends. Any diagnostics, tests, or other procedures may be performed for the sensor and/or sensor IC after the soft handover procedure.

In some examples, soft handover control circuitry includes switches and resistors for a large number of steps, but only a subset of the steps is used due to trimming. In one example, there may be 64 steps in the soft handover control circuitry. However, the device may be trimmed down to 40 steps. Therefore, the soft handover procedure begins with the 40th step, and reduces the voltage reference value step-by-step until all 40 steps are complete. The trim information is stored in nonvolatile memory or hardcoded. After the soft handover procedure ends, the preset amplitude reference voltage may be reset to the voltage value as indicated by the trim information (here, the voltage value at the 40th step), instead of resetting the preset amplitude reference voltage to the full voltage value.

Figure 7:
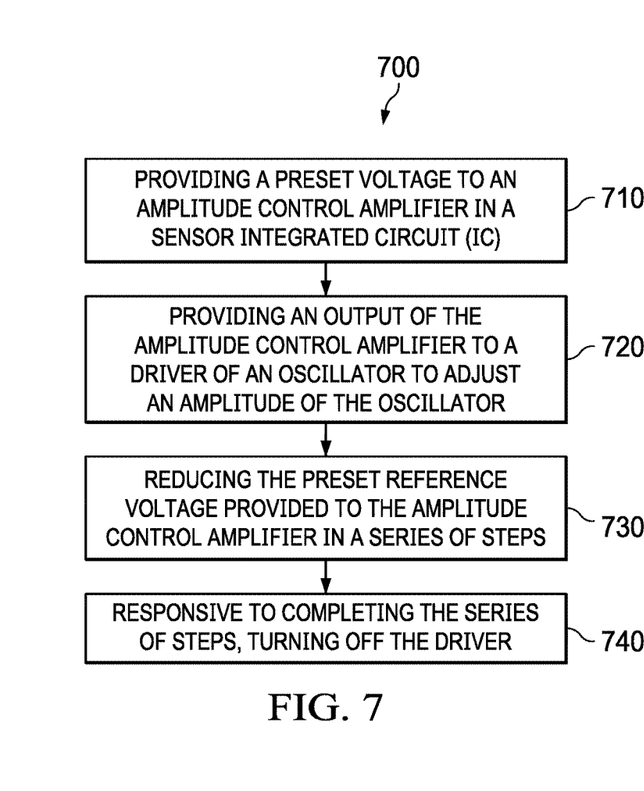
FIG. 7 is flow diagram of a method for a soft handover procedure in accordance with various examples.

FIG. 7 is a flow diagram of a method 700 for a soft handover procedure in accordance with various examples herein. The steps of method 700 may be performed in any suitable order. The hardware components described above with respect to FIGS. 1, 2, 3A, and 4 may perform method 700 in one example.

Method 700 begins at 710, where a preset reference voltage is provided to an amplitude control amplifier in a sensor IC. In one example, the preset reference voltage is provided by a soft handover control circuit, such as soft handover control circuit 310. The preset reference voltage may be a trimmed voltage in some examples. The amplitude control amplifier uses the preset reference voltage to provide a specific output.

Method 700 proceeds to 720, where the amplitude control amplifier provides an output to a driver of an oscillator to adjust an amplitude of the oscillator. The amplitude control amplifier receives the preset reference voltage at a first input, and receives an indication of the differential output voltage value of a driver at a second input. The amplitude control amplifier, such as amplitude control amplifier 308, provides an output signal to a gate of a transistor in the driver, such as transistor 346 in driver 312, in one example. The amplitude control amplifier 308 operates to maintain the differential output voltage value at the level of the preset reference voltage using a control loop. Adjusting the gate voltage of transistor 346 increases or decreases the size of the voltage swing of the oscillator driven by driver 312.

Method 700 proceeds to 730, where a soft handover procedure may be performed by reducing the preset reference voltage provided to the amplitude control amplifier in a series of steps. The process for the soft handover procedure is discussed above with respect to FIGS. 3A and 5B. A digital controller, such as digital controller 334, operates a series of switches that may reduce the preset reference voltage provided to amplitude control amplifier 308 in a series of steps. The switches switch resistors in a resistor network in or out based on signals from digital controller 334. Switching the resistors in or out is used to gradually reduce the preset reference voltage. As the preset reference voltage gradually reduces, the amplitude control amplifier gradually reduces the differential output voltage of driver 312, which reduces the output swing of an oscillator driven by driver 312. Gradually reducing the output swing of the oscillator may allow a second oscillator coupled to the first oscillator to gradually take more of the LC load. The steps for reducing the preset reference voltage continue until the differential output voltage of driver 312 is driven to zero or near zero. At that time, the second oscillator is handling the entire load and the sensor IC may be shut down for diagnostics or to perform other operations.

Method 700 continues at 740, where responsive to completing the series of steps, the driver is turned off In one example, driver 312 may be turned off by digital controller 334 asserting two switches. Specifically, switch 344 turns off transistor 346, and switch 360 turns off transistor 352. With these two transistors turned off, driver 312 is turned off as well. The preset reference voltage may be restored at this time so it is ready for driver 312 being turned back on after diagnostics or other operations are performed.

In examples herein, dual oscillator systems that are useful for providing redundant sensors in safety-critical applications may undergo a soft handover procedure when one of the oscillators is shut down. With the soft handover procedure, at least one oscillator remains in operation at all times, thereby maintaining the operation of a sensor for these safety-critical applications. Due to process variations, one oscillator may be stronger than the other, but the stronger of the two oscillators may not be known. Therefore, both oscillators in the dual oscillator system may undergo a soft handover procedure before being shut down. The soft handover procedure may prevent an interruption in the sensor information provided to a control algorithm or to an ECU. In addition, if sensor ICs are trimmed to meet a specific operating condition, the trim information may be stored and retained for use after the sensor IC restarts.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, a device that is "trimmed" may be trimmed/altered during manufacture of the device, during assembly of the device, during packaging of the device or in operation of the device based on feedback within the device or by external connections to the device.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type MOSFET may be used in place of an n-type MOSFET with little or no changes to the circuit. Furthermore, other types of transistors may be used (such as bipolar junction transistors (BJTs)).

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A sensor circuit comprising:
   a driver;
   an amplitude control amplifier coupled to the driver;
   a common mode control amplifier coupled to the driver; and
   a handover control circuit coupled to the amplitude control amplifier and configured to hand off an operation from the sensor circuit to a different sensor circuit, the handover control circuit including a resistor network coupled to a switch network.

2. The sensor circuit of claim 1, wherein the amplitude control amplifier includes a first input configured to receive an amplitude reference voltage, a second input configured to receive an output voltage of the driver, and an output.

3. The sensor circuit of claim 2, wherein the output voltage of the driver is a differential output voltage of the oscillator.

4. The sensor circuit of claim 1, wherein the common mode control amplifier includes a first input configured to receive a common mode reference voltage, a second input configured to receive a common mode voltage output of the driver, and an output.

5. The sensor circuit of claim 1, wherein the driver includes first and second transistors;
   wherein a first switch is coupled to a gate and a source of the first transistor; and
   a second switch is coupled to a gate and a source of the second transistor.

6. The sensor circuit of claim 5, further comprising a digital controller coupled to the switch network, the first switch, and the second switch.

7. The sensor circuit of claim 1, wherein the driver is adapted to be coupled to a first oscillator, the sensor circuit is a first sensor circuit, and the first oscillator is adapted to be inductively coupled to a second oscillator of a second sensor circuit.

8. A system, comprising:
   a sensor integrated circuit (IC), including:
      a driver configured to produce an oscillating waveform;
      an amplitude control amplifier coupled to the driver and configured to adjust a differential output voltage value of the oscillating waveform;
      a common mode control amplifier coupled to the driver and configured to adjust an average voltage value of the oscillating waveform; and
      a handover control circuit coupled to the amplitude control amplifier, wherein the handover control circuit includes a resistor network coupled to a switch network, and wherein the handover control circuit is configured to repeatedly step down a preset reference voltage provided to the amplitude control amplifier.

9. The system of claim 8, wherein the amplitude control amplifier is configured to receive the preset reference voltage at a first input, receive the differential output voltage value at a second input, and adjust the differential output voltage value responsive to a difference between the differential output voltage value and the preset reference voltage.

10. The system of claim 8, wherein an initial value of the preset reference voltage is a trimmed voltage value.

11. The system of claim 8, further comprising a digital controller configured to:
    control a switch in the switch network to adjust the preset reference voltage provided to the amplitude control amplifier.

12. The system of claim 11, wherein the driver includes a first transistor and a second transistor;
    wherein the first transistor is coupled to the control amplifier and the second transistor is coupled to the common mode control amplifier; and
    wherein the digital controller is configured to:
    turn off the first transistor and the second transistor responsive to stepping down the preset reference voltage to a target voltage.

13. The system of claim 8, wherein the sensor IC is a first sensor IC, and further comprising a first oscillator that is adapted to be inductively coupled to a second oscillator of a second sensor IC, the first oscillator configured to produce the oscillating waveform.

* * * * *